United States Patent [19]

Bach et al.

[11] Patent Number: 4,976,990

[45] Date of Patent: Dec. 11, 1990

[54] PROCESS FOR METALLIZING NON-CONDUCTIVE SUBSTRATES

[75] Inventors: Wolf Bach, Southbury; Donald R. Ferrier, Thomaston; Peter E. Kukanskis, Woodbury; Ann S. Williams, Southbury; Mary J. Senechal, Canton, all of Conn.

[73] Assignee: MacDermid, Incorporated, Waterbury, Conn.

[21] Appl. No.: 331,039

[22] Filed: Mar. 29, 1989

[51] Int. Cl.$^5$ ............................................. C23C 26/00
[52] U.S. Cl. ..................................... 427/98; 427/304; 427/305; 427/306; 427/97
[58] Field of Search ..................... 427/98, 304–306, 427/97

[56] References Cited

U.S. PATENT DOCUMENTS

| | | | |
|---|---|---|---|
| 3,978,252 | 8/1976 | Lombardo | 427/306 |
| 4,259,409 | 3/1981 | Arnold | 427/98 |
| 4,425,380 | 1/1984 | Nuzzi | 427/97 |
| 4,515,829 | 5/1985 | Deckert | 427/97 |
| 4,597,988 | 7/1986 | Kukanskis | 427/97 |
| 4,608,275 | 8/1986 | Kukanskis | 427/97 |
| 4,629,636 | 12/1986 | Courduvelis | 427/444 |
| 4,748,104 | 5/1988 | Ferrier | 427/98 |

OTHER PUBLICATIONS

Peter E. Kukanskis et al., "Improved Chemistry For Through-Hole Plating of Printed Circuit Boards" World Printed Circuit Conference June 1987.

Jeffrey J. Doubrava "The Black Hole and Beyond the Production of Void-Free Plated Through-Holes" PCFAB Aug. 1985 pp. 14, 19, 20, 22, 27–29.

*Primary Examiner*—Shrive Beck
*Assistant Examiner*—Vi Duong Dang
*Attorney, Agent, or Firm*—St.Onge Steward Johnston & Reens

[57] ABSTRACT

Non-conductive surfaces, particularly through-hole surfaces in double-sided or multi-layer printed circuit board, are treated (conditioned) to receive void-free, adherent electroless metal coatings by contact of the surfaces with an organosilane preparatory to catalyzation and metallization.

14 Claims, No Drawings

PROCESS FOR METALLIZING NON-CONDUCTIVE SUBSTRATES

This is a continuation of co-pending application Ser. No. 913,489 filed on Sept. 30, 1986.

BACKGROUND OF THE INVENTION

The present invention relates to the metallization of non-conductive surfaces, more particularly to the metallization of non-conductive surfaces in the course of manufacture of printed circuits, and still more particularly to the electroless metallization of non-conductive through-hole surfaces in double-sided or multi-layer printed circuit boards.

The art long has been familiar with the desirability of providing a metallized coating on non-conductive surfaces for functional and/or aesthetic purposes. A particularly important technological area where the techniques of metallization of non-conductive surfaces have found applicability is in the manufacture of printed circuit boards wherein metallization is used to provide patterned, conductive circuitry on non-conductive (insulating, dielectric) substrate materials.

Within the area of printed circuit board manufacture itself, metallization of non-conductive surfaces may come into play at a number of steps in the overall process. One particular area of substantial import is the electroless metallization of the non-conductive surfaces of through-holes.

In the manufacture of printed circuits, it is now common-place to provide planar boards having printed circuitry on both sides thereof. Of increased importance are so-called multi-layer circuit boards, comprised of laminates of non-conductive substrate and conductive metal (e.g., copper), wherein one or more parallel innerlayers or planes of the conductive metal, separated by non-conductive substrate, are present within the structure. The exposed outer sides of the laminate contain printed circuit patterns as in double-sided boards, and the inner conductive planes may themselves comprise circuit patterns.

In double-sided and multi-layer printed circuit boards, it is necessary to provide conductive interconnection between or among the various layers or sides of the board containing conductive circuitry. This is achieved by providing metallized, conductive through-holes in the board communicating with the sides and layers requiring electrical interconnection. The predominantly-employed method for providing conductive through-holes is by electroless deposition of metal on the non-conductive surfaces of through-holes drilled or punched through the board.

As is well known in the art, electroless deposition of metal onto non-conductive surfaces requires that a material catalytic to the electroless depositing reaction be present on the non-conductive surfaces. In the typical processes relevant to printed circuit board manufacture, wherein through-hole metallization with copper is employed, the catalytic material comprises palladium metal. The process of applying catalytic material to the substrate surfaces, known generally as "activation", most typically involves contact of the substrate with a true or colloidal solution of palladium and tin compounds (generally, chlorides) as described, e.g., in U.S. Pat. Nos. 3,011,920 and 3,532,518. It is generally believed that the tin compounds act as protective colloids for the catalytic palladium. In many cases the activation is followed by an "acceleration" step which serves in some manner to expose (or increase exposure of) the active catalytic species, although activating baths are known which do not require a separate acceleration step. Following provision of catalyst in this manner on the non-conductive surfaces, the surfaces are then contacted with an electroless metal (copper) depositing bath in which catalyzed chemical reduction reactions lead to deposit of metal from the bath onto the catalyzed surfaces.

In utilizing electroless depositing technology for provision of conductive coatings on through-hole surfaces, the patent literature often speaks only generally of the adherence of the catalytic material to the non-conductive surfaces of the through-holes, many times teaching or inferring that the matter is one only of providing sufficient roughening of the surfaces (as might be achieved simply in the hole-drilling process) to promote catalyst adherence. In the practical art of circuit board manufacture, however, the need for complete through-hole coverage with conductive metal (and hence the need for complete catalyzation of the non-conductive through-hole surfaces) is so acute that additional measures usually are taken. One such approach is the process known as "conditioning".

It generally is found that notwithstanding the fact that the topography of the through-hole surfaces can be such (e.g., roughened, pitted) as to promote adhesion of catalyst for electroless metal deposition, the properties of the non-conductive substrate material per se may lead to poor adhesion. A primary example of this is found in the glass-filled epoxy resins which are used extensively in the industry as non-conductive substrate material in printed circuit boards. Glass fibers have been shown to adsorb palladium activating material only poorly, leading in turn to poor (incomplete or too thin) coverage of subsequently electrolessly deposited copper in the through-holes. A possible explanation for this experience is that the glass fibers tend to have a highly negative surface charge and do not attract the typical tin-palladium catalyst particles which also carry negative charge (e.g., due to chloride ion). This experience, as may be expected, also is found with other glass-filled substrates. However, the problem of poor metal coverage in through-holes is not restricted to glass-containing non-conductive substrates, and exists even in those cases where the substrate is composed of any number of a variety of typical, non-glass-containing, non-conductive materials used as circuit board substrates.

In particular response to the problems of poor metal coverage found with epoxy-glass substrates, the art developed printed circuit manufacturing processes which employed a conditioning step preparatory to activation of through-hole surfaces. The conditioning agents chosen were those which function to improve the adsorption of activating material on the glass fiber surfaces and to improve subsequent electroless plate quality, and typically were of the cationic film forming class of compounds. The exposed through-hole surfaces (e.g., epoxy, glass fibers and, for multi-layer boards, edges of copper innerlayers) were thus coated with a film and the catalytic species (and ultimate electroless metal coating) then essentially adhered to and built up on the film.

Although conditioned through-holes result in superior metal coverage therein as compared to non-conditioned through-holes, coverage of through-holes in glass-epoxy substrates using early conditioning technology was far from perfect, particularly as to coverage on the ends of the glass fibers. Improved technology in conditioners has focused on choice of conditioning agents and/or operating parameters which provide for better metal coverage.

While complete coverage of through-holes with metal is essential, it must also be recognized that coverage in and of itself cannot be an end all and be all in any metallization process, and particularly in printed circuit board manufacture. The ultimate criterion for success is that the metallized through-hole retain its integrity throughout the entire board manufacturing process, throughout all operations subsequently conducted on the board (e.g., attachment of components, etc.) and throughout all phases of use of the board. As the art moves progressively towards focus on conditioning through-holes to provide films thereon which completely coat exposed through-hole surfaces, a serious problem is introduced in terms of the integrity of the electroless metal coating. Although not wishing to be bound by theory as such, it is believed that a situation arises where the distance of the metal coating from the actual through-hole surface becomes greater and greater due to the increasing thickness of the conditioning film therebetween. When this distance reaches a certain point, the metal deposit is actually more closely associated with (carried by) the film than with the through-hole surfaces coated by the film. In the processes involved in manufacture and use of the board, the film itself becomes a potential area for failure and can lead to loss of adhesion of the metal in the through-hole, blistering and the like. In multi-layer circuit boards, poor metal adhesion in the through-holes also evidences itself via poor adhesion of the metal to the exposed metal innerlayer surfaces in the through-hole.

Another problem associated with the current art of through-hole conditioners, particularly, it is believed, in the choice of agents based primarily upon their thick film-forming characteristics, is the fact that these films also will, of course, coat all areas of the board, not just through-holes, since the conditioning process involves immersion of the entire board in the conditioning solution. For example, copper-clad substrates with through-holes will, after conditioning, also have the conditioning film on the copper foil surfaces. While the presence of conditioning agents on such surfaces is not per se undesirable and may, indeed, be beneficial in promoting deposited metal adhesion on these surfaces, the known conditioning agents generally leave too thick a coating or film on these surfaces which may result in the films becoming an undesirable barrier to metallization adherence and/or conductivity. For this reason, it is necessary in the art to subject the board to a micro-etching step after conditioning to remove at least some of the conditioning agent from the copper foil surfaces. Although micro-etching will in any event be practiced with copper-clad boards in a printed circuit manufacturing process to remove oxides from the copper surfaces, the foregoing problem imposes on the circuit board manufacturer the constraint of being required to perform the micro-etch after the conditioning step rather than earlier in the process, which, for some processes, would be more economical. Moreover, in the required sequence, conditioning agents gradually will contaminate the micro-etch solution thereby limiting its useful operating life.

SUMMARY OF THE INVENTION

It is an object of the present invention to provide a process for effecting complete and adherent electroless metallization on non-conductive surfaces.

A further object of the invention is to provide a process for effecting complete and adherent electroless metallization on non-conductice surfaces of substrates employed in the manufacture of printed circuit boards.

A more specific object of the present invention is to describe a process for manufacturing printed circuit boards in which the board through-holes are provided with a complete and adherent coverage of conductive metal.

Another specific object of the present invention is to provide a process for conditioning the surfaces of through-holes in printed circuit boards to render them receptive to deposit of conductive metal thereon.

Yet another object of the present invention is to describe a process for conditioning the surfaces of through-holes in double-sided and multi-layer printed circuit boards to render such surfaces receptive to complete and adherent metallization.

These and other objects, which will become apparent from the more detailed description which follows, are achieved through provision of a process for metallizing non-conductive surfaces wherein the non-conductive surfaces, prior to catalytic activation and metallization, are contacted with a conditioning agent comprised of an organic silicon compound.

According to the invention, the organic silicon compounds promote adhesion between the non-conductive surfaces and the catalytic species (e.g., tin-palladium catalyst) used in electroless metal depositing. As a consequence, catalyst is present over all surfaces to be metallized and complete metallization of the surfaces is achieved in the subsequent electroless depositing step. At the same time, it is found that the metal deposit remains strongly adherent to the surfaces on which it is plated.

The present invention has particular applicability to the electroless metallization of non-conductive surfaces of substrates employed in manufacture of printed circuit boards, and even more particularly to the metallization of through-hole surfaces, in which the through-hole surfaces are, prior to their activation and contact with electroless metal depositing baths, contacted with an organic silicon compound. The process results in complete through-hole coverage with metal and, importantly, a metal coating which remains strongly adherent and retains its deposited integrity in the through-hole during all phases of subsequent manufacture and use of the circuit board.

Another advantage found with the invention as it relates to through-hole metallization is that the organic silicon compound used to condition the through-hole, to the extent also deposited on the metal foil layer of a metal-clad substrate, need not be removed from the foil in a micro-etch step, as is the usual case with through-hole conditioners, before proceeding with subsequent step in the board manufacturing process. As a consequence, any needed microetching (e.g., to remove oxide films from the metal foil) can, if desired, be performed at a point in the process prior to the through-hole conditioning step.

The conditioning process of the present invention is useful with any number of different types of non-conductive substrates, such as those used in the manufacture of printed circuit boards, as, for example, thermosetting resins, thermoplastic resins or combinations thereof, with or without reinforcing fibers (e.g., glass), inorganic substrates such as ceramics and the like, and is useful in the manufacture of both double-sided and multi-layer circuit boards.

DETAILED DESCRIPTION OF THE INVENTION

The organic silicon compounds utilized in the present invention are commonly referred to as organofunctional silanes. The dual organic-inorganic functionality of the compounds apparently is responsible for their ability to promote adhesion between non-conductive surfaces and catalytic species used in the metallization process. The preferred class of organo-functional silanes may be represented by the formula

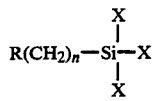

wherein R represents a reactive organic function attached to the silicon atom or to the terminal carbon of the methylene chain bound to the silicon, n represents an integer from 0 to 3, preferably 1 to 3, and wherein X represents a readily hydrolyzable group such as chlorine, methoxy, ethoxy, methoxy-ethoxy and the like.

Examples of particular classes of compounds within this formula representation are the vinylsilanes, aminoalkylsilanes, ureidoalkylsilane esters, epoxyalkylsilanes and methacryloalkylsilane esters, in which the reactive organic functions are, respectively, vinyl, amino, ureido, aliphatic or cycloaliphatic, epoxy and methacryloxy. As examples of the vinylsilanes are vinyltrichlorosilane, vinyltriethoxysilane, vinyltrimethoxysilane, vinyl-tris-(beta-methoxyethoxy) silane and vinyltriacetoxysilane. As examples of the aminoalkylsilanes, which are the preferred organosilanes for use in the present invention, are gamma-aminopropyltriethoxysilane, gamma-aminopropyltrimethoxysilane, N-beta-(Aminoethyl)-gamma-aminopropyltrimethoxysilane, and N'-(beta-aminoethyl)-N-(beta-aminoethyl)-gamma-aminopropyltrimethoxysilane. A suitable ureidoalkylsilane ester is gammaureidoalkyltriethoxysilane, while suitable expoxyalkylsilanes are beta-(3,4-epoxycyclohexyl)-ethyltrimethoxysilane and gammaglycidoxypropyltrimethoxysilane. Useful methacryloxysilane esters are gamma-methacryloxypropyltrimethoxy silane and gamma-methacryloxypropyl-tris-(beta-methoxyethoxy) silane.

The particular organic functionally and hydrolyzable moieties chosen are not particularly critical per se , but care should be exercised in such choice to insure compatibility with other features of the metallization process, for example, to insure that the compound as used is not a poison to the electroless deposition catalyst, or capable of polymerizing to greater than desired thickness once deposited on the through-hole surfaces, or other like considerations.

The organosilanes generally are provided in the form of liquid admixtures for the conditioning process according to the present invention, utilizing water, optionally with other water-miscible liquids, as the liquid carrier. As applied to the conditioning of through-holes, the process is effected by immersion of the throughhole containing board in the aqueous admixture for a time sufficient to provide on the through-hole surfaces a layer (essentially monomolecular) of the organosilane. For metallization of non-conductive surfaces whose geometry permits, provision of the organosilane on the surfaces can alternatively be effected by a spraying or other coating operation. Typically, the concentration of organosilane in the conditioning agent solution can range anywhere from 0.5 to 25 g/l, with a preferred range being from about 0.5 to about 8 g/l, and a most preferred range being from about 2 to about 7.5 g/l; as is apparent, however, optimum concentration ranges will vary depending upon the particular organosilane employed. The temperature of the aqueous admixture at which immersion of the board therein takes place may vary widely, and generally will range from about room temperature up to about 65°C. The time of contact is simply that required to leave the organosilane layer on the non-conductive surfaces to be metallized; depending upon the particular organosilane, substrate material and temperature, this time can be anywhere from, e.g., 30 seconds to ten (10) minutes. An advantage of the invention is that, unlike conventional conditioners, most of the organosilanes utilized will not develop increased layer thickness on the non-conductive surfaces with increasing contacting time. This renders the conditioning process somewhat foolproof in terms of contact time. With conventional conditioning agents (e.g., cationic film-forming compounds), too lengthy an immersion time can lead to polymerization and growth in thickness of the film, undesirably increasing the distance between non-conductive surface and the ultimate metal deposit.

The aqueous organosilane admixture utilized for conditioning according to the present invention will, in general, be inherently slightly alkaline, and may be utilized as such in the inventive method. A preferred pH range is from about 7 to about 11, preferably 7.5 to 9.5, which, for many organosilanes, will inherently result from their dissolution in water but which also can be attained using conventional pH adjusting agents if required. In the preferred practice of the invention, a buffering agent will be added to the aqueous admixture to maintain pH in the preferred 7.5 to 9.5 range, a suitable such buffer being borax decahydrate ($Na_2B_4O_7 \cdot 10H_2O$).

In carrying out the process of the present invention for the conditioning and metallization of through-holes in printed circuit boards, any planar (rigid or flexible) circuit board material containing through-holes which require metallization can be employed. As noted earlier, the circuit board to be treated can be a double-sided board, in which case the through-hole surfaces are composed solely of the material of the non-conductive substrate, or a multi-layer board, in which case the through-hole surfaces are comprised of alternating layers of non-conductive substrate and the exposed edges of metal (e.g., copper) innerlayers. The non-conductive substrate material typically will be a glass-filled epoxy or a polyimide, but can in general be an suitable insulating thermosetting or thermoplastic material or combination thereof, including glass or fiber impregnated forms thereof, such as allyl phthalates, epoxy resins, polyesters, phenolics, acrylics, polyethylene, ABS terpolymers and the like. In carrying out the invention for conditioning and metallizing non-conductive surfaces per se, i.e., whether through-hole surfaces or otherwise, the process is applicable to any non-conductive substrate such as those recited above, inorganic materials such as ceramics, and the like. The invention also has applicability to the metallization of molded printed circuit boards such as those molded, for example, from polysulfones.

In a typical process for the conditioning or metallization of through-holes, the substrate board material, such as copper-clad glass-filled epoxy or copper-clad flexible polyimide (e.g., duPont Kapton) or multilayers of polyimide and adhesive-coated flexible polyimide, is provided with through-holes by drilling or punching, the holes then scrubbed and de-burred and the board immersed in the aqueous conditioning admixture (for mass manufacture, a number of boards typically are racked at this point for conditioning and further processing), the conditioning admixture being an aqueous admixture of organosilane according to the invention which may, if desired, further contain additional water-miscible liquids such as organic alcohols. At this point in the process, the board is subjected to a micro-etch step to remove oxides from the metal or metal-clad boards. Since, in contrast to use of conventional conditioners, micro-etching is not required to remove conditioning agent from the metal cladding in the present invention, this micro-etch step can, alternatively, be conducted prior to the conditioning step.

The through-hole metallization process thereafter conducted is, in general terms, comprised of the separate steps of catalyzing the conditioned through-hole surfaces and then metallizing the conditioned and catalyzed through-hole surfaces via electroless metal deposition. The catalyzation step itself may consist of a number of steps, but functionally the ultimate aim is to adherently provide on the conditioned through-hole surfaces sufficient species catalytic to electroless deposition to permit complete metal coverage of the through-hole. In general, any species catalytic to the desired electroless metallization can be employed, but the predominantly-employed catalyst for electroless deposition, particularly for electroless copper, is the tin-palladium catalyst. In older processes, this catalysis involved a two-step procedure wherein the substrate is first contacted with a dilute stannous chloride solution and then with a solution of palladium chloride. In the process as now predominantly conducted, a one-step activation is employed using a single bath made up of tin and palladium chloride. See, for example, U.S. Pat. No. 3,011,920 and U.S. Pat. No. 3,532,518 describing use of these true or colloidal sols or solutions, which patents are incorporated herein by reference. This one-step activation process generally is followed by an acceleration step which functions either to remove excess tin deposits or alter the valence of the tin compounds or other mechanism to stabilize the catalyst on the substrate surface and insure its exposure in the subsequent electroless metallization. Where an acceleration step is employed, particularly preferred is the use of an oxidizing accelerator as described in U.S. Pat. No. 4,608,275 to Kukanskis, et al., incorporated herein by reference. One-step catalysts also are known which do not require acceleration, such as the organic acid-containing compositions described in Canadian Pat. No. 1,199,754 of Rhodenizer, also incorporated by reference herein.

As a consequence of the invention, the organosilane conditioning agent promotes adhesion between the through-hole surfaces and the catalytic species without interposing between them a barrier or layer so thick as to bring about poor or weakened adhesion between the through-hole surfaces and the eventual metallized layer. After this catalyzation step, the board material is immersed in an electroless metal (e.g., copper, nickel) depositing solution and the catalyzed chemical reduction brings about metal deposit on the catalyzed areas. Any suitable electroless metal depositing bath can be employed, such as formaldehyde-reduced copper baths, hypophosphite-reduced copper baths, hypophosphite-reduced nickel baths, borohydride-reduced nickel baths and the like. Examples of suitable hypophosphite-reduced copper baths are those described in U.S. Pat. Nos. 4,209,331 and 4,279,948, incorporated herein by reference. After electroless metal depositing, the boards are rinsed and then further processed in known manner to provide predetermined circuit patterns on the board surfaces.

The through-hole conditioning process of the present invention may be conducted in association with desmearing and/or post-desmearing processes utilized with multi-layer circuit boards to remove from exposed metal innerlayer surfaces in through-holes the resinous smear which can deposit thereon during hole-drilling and/or to treat through-hole surfaces after desmearing to alter surface topography. See generally, Kukanskis, "Improved Smear Removal", CIRCUITS MANUFACTURING, Mar., 1983, pp. 573–574 and U.S. Pat. Nos. 4,597,988; 4,425,380; and 4,515,829, incorporated herein by reference.

The determination of the degree of through-hole coverage with metal achieved in a plated through-hole process is most accurately performed by means of a backlight test. In this test, a sample is prepared by cutting a thin section through the center of a row of plated holes (see, e.g., IPC Test Methods Manual, No. 2.1.1, Aug., 1980 "Microsectioning") and the slice then lit from behind with a transmitted light source of typically 10 to 20 watts and the half-hole then observed at 50–100X magnification. The complete absence of transmitted light (a "black hole") is taken as the standard for perfect, complete electroless metal coverage.

As noted earlier, however, perfect void-free metal coverage, while essential, is not the only criterion for judging plated through-hole quality. The plated through-hole also must exhibit excellent hole-wall adhesion, i.e., the deposited electroless layer must remain uniform and adhered to the through-hole throughout the variety of processes encountered in printed circuit board manufacture and use. One way to measure this characteristic of plated through-holes is in thermal stressing tests after exposure to high temperature solder float, as set forth in IPC Test Methods Manual, No. 2.6.8., Dec., 1983, generally after first depositing 25$\mu$ of electrolytic acid copper on the metallized through-hole surfaces. In the present invention, the organosilanes are capable of promoting adhesion of catalyst and metal deposit to the through-hole surfaces without introducing problematical barriers or films which lead to blistering or separation of the electroless metal layer in the through-hole.

The invention is further illustrated in the following examples.

EXAMPLE 1

A copper-clad glass-filled epoxy substrate having drilled through-holes is immersed in an aqueous admixture containing 2.5 g/l decahydrated borax and 5.0 g/l gamma-aminopropyltriethoxysilane (pH 9.6; temperature =110°F.) for five (5) minutes and is then water rinsed for two (2) minutes at room temperature. The board is then immersed in an aqueous peroxide/sulfuric acid microetchant solution (MacDermid, Inc., G-6) for two (2) minutes at 90°F., water rinsed for two (2) minutes, immersed in a chloride pre-dip (Metex Predip 9008, MacDermid, Inc.) for one minute at 90°F. and then immersed in a one-step tin-palladium catalyst solution as per U.S. Pat. No. 3,532,518 for five (5) minutes at 90°F. After a two (2) minute water rinse, the board is immersed in an alkaline oxidizing acceleration bath according to U.S. Pat. No. 4,608,275 containing sodium chlorite for two (2) minutes at room temperature, water rinsed for two (2) minutes and then immersed in a formaldehyde-reduced electroless copper bath (MACu Dep 52, MacDermid, Inc., Waterbury, Conn.) for thirty (30) minutes at 100°F. Following a five (5) minute water rinse and drying, the board is tested in standard tape test for copper to copper adhesion and, for the through-holes, in backlight tests and thermal cycling tests (the latter after deposit of 25μ electrolytic acid copper on the metallized through-hole surfaces), and found to have excellent, adherent copper metal coverage in the through-holes and on the copper foil surfaces.

EXAMPLES 2-7

Example 1 is repeated with substitution of the organosilanes set forth below for the silane shown in Example 1.

| Example | Organosilane |
|---|---|
| 2 | gamma-aminopropyl-trimethoxysilane |
| 3 | N-beta-(Aminoethyl)-gamma-aminopropyl-trimethoxysilane |
| 4 | N'-(beta-aminoethyl-N-(beta-aminoethyl)-gamma-aminopropyl-trimethoxysilane |
| 5 | gamma-methacryloxypropyl-trimethoxysilane |
| 6 | Vinyltriethoxysilane |
| 7 | beta-(3,4-epoxycyclohexyl)-ethyltrimethoxysilane |

In each case, plated through-hole coverage and adherence is excellent, with the aminoalkylsilanes (Examples 1 and 2-4) demonstrating comparatively best results.

EXAMPLE 8

Example 1 is repeated with the exception of first immersing the board in the microetchant ($H_2SO_4$/$H_2O_2$) solution, followed by rinsing, conditioning, rinsing, chloride pre-dip, etc. Backlight and thermal cycling results are as in Example 1.

EXAMPLE 9

Example 1 is repeated identically with the exception that the board material is a copper-clad polyimide laminate rather than epoxy-glass. Through-hole coverage and adherence is excellent.

EXAMPLE 10

A copper-clad flexible polyimide (Kapton, E. I. du-Pont deNemours & Co.) circuit board material with drilled through holes is subjected to the conditioning, rinsing, microetching and rinsing steps of Example 1. Thereafter, the board is immersed in an acid predip for 1 minute at 90°F. (MacDermid followed by immersion in a tin-palladium catalyst solution (Mactivate 10, MacDermid, Inc.) for five (5) minutes at 90°F. After rinsing, the board is immersed in a sulfate-containing accelerator for two (2) minutes at 90°F., rinsed, and the through-holes metallized in MACu Dep 52 electroless copper bath for thirty (30) minutes at 100°F. Following rinsing, through-hole coverage and copper adhesion are excellent.

In additional exemplary processes, all providing similar excellent results, the epoxy-glass board material of Example 1 and the conditioning solution of Example 1 are used in cycles in which a variety of different tin-palladium catalyst preparations, accelerators and electroless copper baths (including hypophosphite-reduced baths) are employed.

EXAMPLE 11

The processes of Examples 1, 8, 9 and 10 are repeated using as the conditioning agent a solution made by adding 20 ml. of 50% (by weight) sodium hydroxide to 500 mls. of distilled water and mixing thoroughly, to which is then added, with thorough mixing 2 grams of gamma-glycidoxypropyltrimethoxysilane.

EXAMPLE 12

An acrylonitrile-butadiene-styrene (ABS) terpolymer is decoratively metallized with copper by first subjecting the plastic to a chrome/sulfuric acid etchant at 155°F. for seven (7) minutes, rinsing three times with water at room temperature (one minute each rinsing), contacting with a neutralizing bath (MacDermid 9338) for one minute at room temperature and then rinsing with water for two minutes. The plastic is then processed according to the remaining steps of Example 1 beginning with the conditioning step but eliminating the micro-etch step, resulting in adherent deposit of electroless copper on the substrate.

EXAMPLE 13

A molded polysulfone printed circuit board substrate is provided with an electroless copper layer by first contacting the board with swelling solvent predip for ten minutes at 100°F., water rinsing for three minutes at 150°F., contacting with a chrome/sulfuric acid etchant for fifteen minutes at 165°F., rinsing three times with room temperature water (one minute each rinse), and then processing according to the remaining steps of Example 1, beginning with the conditioning step but eliminating the micro-etch step, to deposit complete and adherent electroless copper thereon.

EXAMPLE 14

A multi-layer copper-clad circuit substrate comprised of epoxy-glass non-conductive resin and copper innerlayers, having through-holes drilled therein, is first treated with an organic solvent for the epoxy (MacDermid 9204) for five minutes at 100°F., followed by rinsing for two minutes with room temperature water, followed by contact with alkaline permanganate (MACu-DIZER 9275) for ten minutes at 165°F. to remove resin smear from the copper innerlayer surfaces and to micro-roughen the epoxy resin surface, followed by a ten minute room temperature water rinse, contact with neutralizer for the permanganate (MacDermid 9279) for five minutes at 100°F., and room temperature water rinse for five minutes. Thereafter, the processing sequence is as in Example 1 beginning with the conditioning step.

EXAMPLE 15

A ceramic insulating material is provided with electroless copper coverage by first contacting the ceramic with alkaline permanganate (MACuDIZER 9275) for ten minutes at 165°F., room temperature water rinsing for ten minutes, treating with combined acid neutralizer/glass etchant (MacDermid 9278/9279) for three minutes at 90°F., room temperature water rinsing for five minutes, contacting with 5% sulfuric acid for one minute at room temperature, rinsing for two minutes with room temperature water, and then further processing according to the steps of Example 1, beginning with the conditioning step but with elimination of the micro-etch step.

EXAMPLE 16

As noted earlier, one significant advantage of the conditioning process according to the invention is that the conditioning agent employed, in contrast to known conditioning agents, does not tend to increased thickness build-up as a function of increased time of contact of substrate therewith. As a result, the process provides more latitude to the operator and, more significantly, provides its own inherent safeguard against over-conditioning. In a comparative experiment, the process of Example 1 was performed on two separate, identical epoxy-glass substrate samples containing through-holes. For the first sample (A), the Example 1 sequence was altered by contact with the organosilane conditioner for ten rather than five minutes, followed by rinsing for thirty seconds rather than two minutes. For the second sample (B), these same changes were made with the additional change of using a known cationic film-forming conditioner (MacDermid 9076) in place of the organosilane. In thermal stressing tests after completion of the process, sample B displayed significant hole wall pull-away (lack of metal adhesion) while sample A displayed excellent adhesion just as in Example 1.

As will be evident from the foregoing, the present invention provides an effective means for conditioning through-holes of any non-conductive material used as a circuit-board substrate, or any laminate of metal and non-conductive material, to provide complete metallization while avoiding the concomitant problem of having the conditioning agent itself become so pronounced a coating as to reduce ultimate adhesion of the metal layer to the through-hole surfaces, as well as adhesion of metal layer to metal cladding and metal innerlayer surfaces if present. Although the examples presented in this regard relate substantially to metal (foil) clad substrates used in the manufacture of printed circuit boards according to subtractive techniques, the processes are equally applicable to electroless metal plating processes (e.g., through-hole plating) encountered in processes for making printed circuit boards according to additive or semi-additive techniques. More broadly, however, the process of the invention provides a means of metallizing, for functional or decorative purposes, any non-conductive surface, be it organic or inorganic, unfilled or fiber-filled, etc., so as to provide not only complete deposited metal coverage but also excellent adherence and maintained integrity of the deposited metal. While illustrated with respect to certain preferred embodiments, the invention is subject to numerous obvious modifications and variations within the scope thereof, as defined by the appended claims.

What is claimed is:

1. A process for providing a full-coverage, essentially void-free, adherent metal layer on the surface of a non-conductive material, said surface consisting of the surface of a through-hole formed in a printed circuit board substrate material comprised of a glass-reinforced thermosetting or thermoplastic material, said process comprising the steps of: contacting said surface with a conditioning agent consisting essentially of an organosilane compound for a time sufficient to deposit said compound on said surface; depositing on the so-treated surface species catalytic to electroless metal deposition; and contacting said catalyzed surface with an electroless metal depositing solution to deposit metal fully and adherently and essentially void-free onto said catalyzed surface.

2. A process for fully covering with an adherent essentially void-free metal layer the non-conductive surfaces of a through-hole formed in a printed circuit board substrate material comprised of glass-reinforced thermosetting or thermoplastic material, said process comprising the steps of: contacting said surfaces with a conditioning agent consisting essentially of an organosilane compound for a time sufficient to deposit said compound on said through-hole surfaces; depositing on the so-treated through-hole surfaces species catalytic to electroless metal deposition; and contacting the catalyzed through-hole surfaces with an electroless metal depositing solution to deposit metal fully and adherently and essentially void-free onto said catalyzed through-hole surfaces.

3. In a process for manufacturing printed circuit boards of the double-sided type in which a planar non-conductive substrate material comprised of a glass-reinforced thermosetting or thermoplastic material is provided with conductive circuit patterns on both sides thereof, and in which through-holes are provided through said non-conductive substrate, the surfaces of said through-holes being metallized to provide conductive interconnection between the conductive circuitry patterns on both sides of said substrate, the improvement comprising metallizing the surfaces of said through-holes by a process comprising the steps of: contacting said surfaces with a conditioning agent consisting essentially of an organosilane compound for a time sufficient to deposit said compound on said surfaces; depositing on the so-treated surfaces species catalytic to electroless metal deposition; and contacting the catalyzed through-hole surfaces with an electroless depositing solution to deposit metal fully and adherently and essentially void-free onto said catalyzed through-hole surfaces.

4. In a process for manufacturing printed circuit boards of the multi-layer type, in which a planar composite substrate material is provided comprised of a laminate of alternating parallel layers of metal and non-conductive, glass-reinforced thermosetting or thermoplastic material, and in which through-holes are provided through said composite substrate, the surfaces of said through-holes being metallized to provide conductive interconnection among metal portions of said composite substrate, the improvement comprising metallizing the surfaces of said through-holes by a process comprising the steps of: contacting said surfaces with a conditioning agent consisting essentially of an organosilane compound for a time sufficient to deposit said compound on said surfaces; depositing on the so-treated surfaces species catalytic to electroless metal deposition; and contacting the catalyzed through-hole surfaces with an electroless metal depositing solution to deposit metal fully and adherently and essentially void-free onto said catalyzed through-hole surfaces.

5. In a process for manufacturing printed circuit boards of the multi-layer type, in which a planar composite substrate material is provided comprised of a laminate of alternating parallel layers of metal and non-conductive, glass-reinforced thermosetting or thermoplastic material, and in which through-holes are provided through said composite substrate, the surfaces of said through-holes being first subjected to a desmearing process and then metallized to provide conductive interconnection among metal portions of said composite substrate, the improvement comprising metallizing the surfaces of said desmeared through-holes by a process comprising the steps of: contacting said surfaces with a conditioning agent consisting essentially of an organosilane compound for a time sufficient to deposit said compound on said surfaces; depositing on the so-treated surfaces species catalytic to electroless metal deposition; and contacting the catalyzed through-hole surfaces with an electroless metal depositing solution to deposit metal fully and adherently and essentially void-free onto said catalyzed through-hole surfaces.

6. The process according to any of claims 1, 2, 3, 4 or 5 wherein said organosilane is a compound represented by the formula:

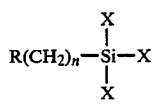

wherein R represents a reactive organic function attached to the silicon atom or to the terminal carbon of the methylene chain bound to the silicon, X represents a readily hydrolyzable moiety, and n is an integer from 0 to 3.

7. The process according to any of claims 1, 2, 3, 4 or 5 wherein said organosilane compound is an aminoalkylsilane.

8. The process according to any of claims 1, 2, 3, 4 or 5 wherein said organosilane compound comprises an aqueous admixture containing said compound.

9. The process according to any of claims 1, 2, 3, 4 or 5 wherein said organosilane compound comprises an aqueous admixture containing said compound in a concentration of from about 0.5 to about 25 g/1.

10. The process according to any of claims 1, 2, 3, 4 or 5 wherein said organosilane compound comprises an aqueous admixture containing said compound, said aqueous admixture having a pH of from about 7.5 to about 11.

11. The process according to any of claims 2, 3, 4 or 5 wherein said substrate material is metal-clad on its outerfacing surfaces at the time of said process for metallizing said through-hole surfaces.

12. A process for providing metallized through-holes in a printed circuit board of the double-sided or multi-layer type, comprising the steps of:
(a) providing a printed circuit substrate material comprised of a member selected from the group consisting of (1) a planar non-conductive material comprised of glass-reinforced thermosetting or thermoplastic material clad with metal on both sides thereof and (2) a planar material comprised of alternating layers of metal and non-conductive material comprised of glass-reinforced thermosetting or thermoplastic material, the outer-facing planar surfaces of which are clad with metal;
(b) forming through-holes through said printed circuit substrate material;
(c) contacting the surfaces of said through-holes with a conditioning agent consisting essentially of an organosilane compound for a time sufficient to deposit said compound on said through-hole surfaces;
(d) thereafter depositing on the so-treated through-hole surfaces species catalytic to electroless metal deposition; and
(e) thereafter contacting said catalyzed through-hole surfaces with an electroless metal depositing solution to deposit metal fully and adherently and essentially void-free onto said catalyzed through-hole surfaces.

13. The process according to claim 12 wherein said printed circuit board is of the multi-layer type and wherein said through-hole surfaces are desmeared between steps (b) and (c).

14. A process for providing a full-coverage, essentially void-free, adherent metal layer on the surface of a non-conductive material, said surface consisting of the surface of a through-hole formed in a printed circuit board substrate material comprised of a glass-reinforced thermosetting or thermoplastic material, said process comprising the steps of: contacting said surface with a conditioning agent consisting essentially of an organosilane compound for a time sufficient to deposit said compound on said surface; depositing on the so-treated surface species catalytic to electroless metal deposition; and contacting said catalyzed surface with an electroless metal depositing solution to deposit metal fully and adherently and essentially void-free onto said catalyzed surface, wherein said organosilane compound is selected from the group consisting of aminoalkylsilanes, vinylsilanes, ureidoalkylsilane esters, epoxyalkylsilanes, and methacryloalkylsilane esters.

* * * * *

UNITED STATES PATENT AND TRADEMARK OFFICE
CERTIFICATE OF CORRECTION

PATENT NO. : 4,976,990
DATED : December 11, 1990
INVENTOR(S) : Wolf Bach, et al.

It is certified that error appears in the above-identified patent and that said Letters Patent is hereby corrected as shown below:

Title Page, after the line beginning with item "[22]", insert:
-- Related U.S. Application Data
[63] Continuation of Ser. No. 165,453, March 1, 1988, abandoned, which is a continuation of Ser. No. 913,489, Sept. 30, 1986, abandoned. --

Column 1, line 5, delete "co-pending"

Column 1, line 5, after "of", insert -- application Ser. No. 165,453, filed March 1, 1988, now abandoned, which is a continuation of --

Column 1, line 6, after "1986" insert --, now abandoned --.

Column 9, lines 34, change "N'-(beta-aminoethyl-" to -- N'-(beta-aminoethyl)- --

Signed and Sealed this

Twenty-eighth Day of April, 1992

Attest:

HARRY F. MANBECK, JR.

*Attesting Officer*  *Commissioner of Patents and Trademarks*